(12) United States Patent
Merlin et al.

(10) Patent No.: US 7,808,029 B2
(45) Date of Patent: Oct. 5, 2010

(54) MASK STRUCTURE FOR MANUFACTURE OF TRENCH TYPE SEMICONDUCTOR DEVICE

(75) Inventors: Luigi Merlin, Turin (IT); Giovanni Richieri, Druento (IT); Rossano Carta, Turin (IT)

(73) Assignee: Siliconix Technology C.V., Singapore (SG)

( * ) Notice: Subject to any disclaimer, the term of this patent is extended or adjusted under 35 U.S.C. 154(b) by 185 days.

(21) Appl. No.: 11/738,802

(22) Filed: Apr. 23, 2007

(65) Prior Publication Data

US 2007/0254452 A1 Nov. 1, 2007

Related U.S. Application Data

(60) Provisional application No. 60/795,026, filed on Apr. 26, 2006.

(51) Int. Cl.
*H01L 29/94* (2006.01)

(52) U.S. Cl. .............................. 257/302; 257/E27.091; 257/E29.2; 257/E29.257; 257/E29.26; 257/E21.551; 438/242; 438/246; 438/424; 438/514; 438/700

(58) Field of Classification Search .................. 430/5; 438/155, 246, 389, 242; 257/E21.201, 302
See application file for complete search history.

(56) References Cited

U.S. PATENT DOCUMENTS

| | | | | |
|---|---|---|---|---|
| 4,420,344 A | * | 12/1983 | Davies et al. | 438/232 |
| 5,382,541 A | | 1/1995 | Bajor et al. | |
| 5,495,441 A | * | 2/1996 | Hong | 365/185.01 |
| 5,747,831 A | * | 5/1998 | Loose et al. | 257/77 |
| 5,827,753 A | * | 10/1998 | Huang et al. | 438/24 |
| 6,291,918 B1 | | 9/2001 | Umeda et al. | |
| 6,342,430 B1 | * | 1/2002 | Adams et al. | 438/424 |
| 6,573,534 B1 | | 6/2003 | Kumar et al. | |
| 2001/0038972 A1 | * | 11/2001 | Lyons et al. | 430/313 |
| 2002/0081795 A1 | * | 6/2002 | Kim et al. | 438/200 |
| 2003/0003680 A1 | | 1/2003 | Raineri et al. | |
| 2003/0032227 A1 | * | 2/2003 | Ohara et al. | 438/197 |
| 2003/0045098 A1 | | 3/2003 | Verhaverbeke et al. | |
| 2003/0178672 A1 | * | 9/2003 | Hatakeyama et al. | 257/328 |
| 2004/0014291 A1 | | 1/2004 | Mehrad et al. | |
| 2005/0285271 A1 | | 12/2005 | Watanabe | |

FOREIGN PATENT DOCUMENTS

JP 04243128 * 8/1992 ........ 438/FOR. 154

* cited by examiner

*Primary Examiner*—Charles D Garber
*Assistant Examiner*—Yasser A Abdelaziez

(57) ABSTRACT

A mask structure and process for forming trenches in a silicon carbide or other wafer, and for implanting impurities into the walls of the trenches using the same mask where the mask includes a thin aluminum layer and a patterned hard photoresist mask. A thin LTO oxide may be placed between the metal layer and the hard photoresist mask.

23 Claims, 1 Drawing Sheet

MASK STRUCTURE FOR MANUFACTURE OF TRENCH TYPE SEMICONDUCTOR DEVICE

RELATED APPLICATIONS

This application claims the benefit of U.S. Provisional Application No. 60/795,026, filed Apr. 26, 2006, the entire disclosure of which is incorporated by reference herein.

FIELD OF THE INVENTION

This invention relates to a process for the manufacture of trench type semiconductor devices and more specifically relates to a novel mask structure for such processes.

BACKGROUND OF THE INVENTION

Mask structures are commonly used to control the etching of silicon trenches and for the control of the implantation of impurities into such structures. Such mask structures are complex and frequently cannot be used in connection with certain substrate materials, for example, silicon carbide (SiC) which requires long and high temperature process steps. It would be desirable to have a mask process that can be used with SiC substrates, including 4H silicon carbide, as well as other substrates such as silicon and the like, in which a single mask structure can be employed for the trench etch process or for both the trench etch and implantation process.

BRIEF DESCRIPTION OF THE INVENTION

In accordance with the invention, a mask is formed by a photo resist hard mask atop a thin metal layer (for example, 5000 Å aluminum) which covers an oxide layer (1 μm LTO) atop the substrate. Where an SiC substrate is used, and a JFET (for example) is to be formed, the trench needed may be about 2 μm deep and 1 to 3 μm wide, with adjacent trenches being spaced by mesas about 1.5 to 2.0 μm wide. A photoresist (PR) mask layer is preferably a positive PR and, after development, will permit the opening of windows and the plasma etch of the exposed underlying metal and oxide and the subsequent plasma etch of spaced trenches into the substrate. The mask can resist the lengthy etch processes and be available as a mask to subsequent ion implantation processes.

Thus, the hard mask of the invention can be used for two distinct process steps; the trench gate formation (for a JFET) and an ion implantation doping self-aligned mask.

The hard mask material selection takes into account plasma etch selectivity and ion stopping or blocking range capability, related to the implant ion species and energy. The mask thickness is adjusted to the substrate material.

While the invention is applied in the following example to an SiC JFET, the invention is applicable to any trench semiconductor device such as MOSFETs, IGBTs and the like and to other substrate materials than SiC.

Further, it is possible in some applications to eliminate the oxide buffer layer beneath the metal layer.

DESCRIPTION OF THE DRAWINGS

In FIG. 1, the wafer 10 is SiC although other materials could be used. Where the device to be made is a JFET, the starting wafer has an $N^+$ substrate drain body 11 which may have a thickness of about 350 μm and a concentration of about 1.8 E 18. An $N^+$ buffer layer 12 is atop drain region 11 and an N type drift region 13 is atop the buffer layer. An $N^+$ source region 14 is atop the drift layer 13.

Figure 1:
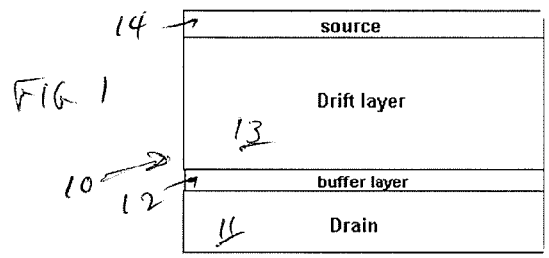
FIG. 1 shows a small portion of a starting wafer 10 in cross section.
Figure 2:
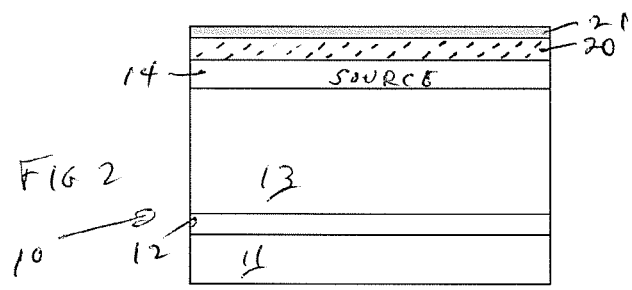

The first process step is shown in FIG. 2 and comprises the formation of oxide 20 (for example, LTO) atop the wafer 10. Oxide 20 may have a thickness of about 0.8 μm. An Aluminum layer 21 is then deposited atop oxide 10 to a thickness of about 0.5 μm.

Other options for the layers 20 and 21 which reduce the total mask thickness are, for example, 0.1 to 1.0 μm oxide and 0.1 to 1.0 μm of aluminum or some other suitable metal.

Note that in some cases, the oxide barrier 20 may be completely removed.

Figure 3:
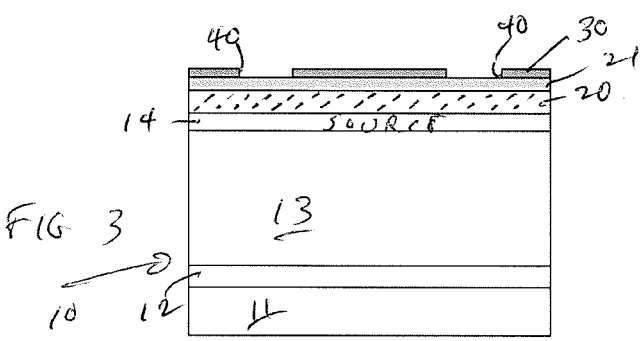

Thereafter, a photoresist (PR) layer 30 (FIG. 3) is formed atop metal layer 21 and is marked and developed as shown, forming spaced etch windows 40 atop the layer 21.

Photo resist 30 is preferably a positive PR, and is employed in the novel hard mask structure of the invention for the subsequent trench/implant steps to be performed.

Figure 4:
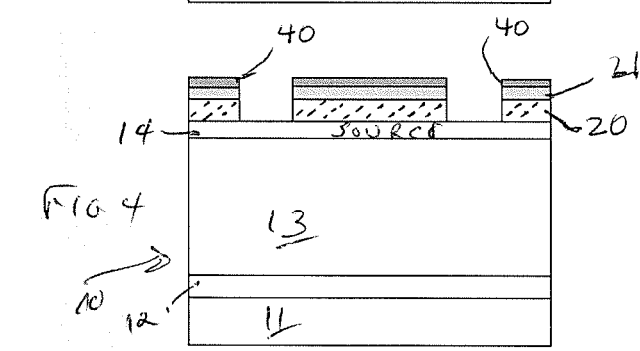

Thereafter, and as shown in FIG. 4, the metal layer 21 and oxide layer portions exposed by windows 40 are plasma etched to the SiC surface of wafer.

Figure 5:
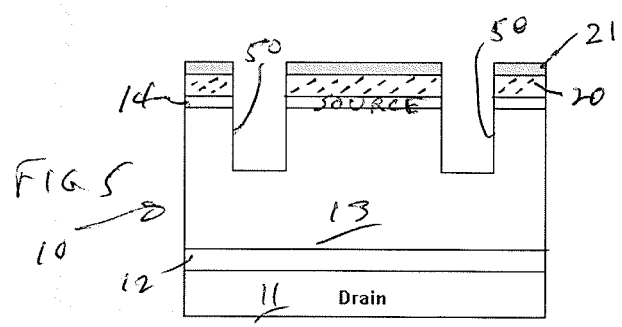

Finally, as shown in FIG. 5, a dry plasma etch is employed to etch spaced trenches 50 into the SiC drift layer 13.

Photo resist 40 may be removed and the remaining hard photoresist mask 20/21 is left in place for a subsequent ion implant into the trench walls of trenches.

The trench walls of trenches 50 may be vertical or may form an angle of 80° to 90° (vertical) to the wafer surface. That is, the walls of the trenches may be up to 10° C. to a vertical line through the center of the trench and perpendicular to the plane of the wafer.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A hard mask comprising:
   a semiconductor wafer;
   a hard photoresist mask atop said wafer, wherein said hard photoresist mask comprises a metal layer, and wherein a first portion of said hard photoresist mask resists an etching process; and
   a trench gate extending through a second portion of said hard photoresist mask, wherein said trench gate is ion implanted using said first portion of said hard photoresist mask.

2. The hard mask of claim 1, wherein said hard photoresist mask further comprises:
   an oxide layer, wherein said oxide layer is between said metal layer and said wafer.

3. The hard mask of claim 1, wherein said wafer is silicon carbide.

4. The hard mask of claim 2, wherein said wafer is silicon carbide.

5. The hard mask of claim 1, wherein said trench gate extends through said second portion of said hard photoresist mask and a portion of said wafer.

6. The hard mask of claim 5, wherein said hard photoresist mask further comprises:
   an oxide layer, wherein said oxide layer is between said metal layer and said wafer.

7. The hard mask of claim 5, wherein said wafer is silicon carbide.

8. The hard mask of claim 5, wherein the walls of said formed trench gate form an angle of 0° to 10° to a vertical line through said formed trench gate which is perpendicular to the plane of said wafer.

9. The hard mask of claim 1, wherein said metal layer is aluminum having a thickness of from about 0.1 μm to about 1 μm.

10. The hard mask of claim 2, wherein said oxide layer has a thickness of about 0.1 μm to about 1.0 μm.

11. The hard mask of claim 9, wherein said oxide layer has a thickness of about 0.1 μm to about 1.0 μm.

12. The process of forming a trench in a semiconductor wafer comprising:
   depositing a metal layer atop surface of said wafer;
   depositing a photoresist atop said metal layer;
   applying a patterned mask atop said photoresist;
   photolithographically developing said photoresist to form a hard photoresist mask which contains windows corresponding to the pattern of said mask;
   removing portions of said metal layer that are exposed through said windows;
   forming a trench into the top surface of said wafer which is exposed after the portions of said metal layer that are removed, wherein a portion of said hard photoresist mask resists etching associated with said forming; and
   implanting a controlled impurity into trench walls of said trench using said portion of said hard photoresist mask.

13. The process of claim 12, wherein said process further comprises:
   forming an oxide layer directly atop said wafer surface and directly below said metal layer; and
   removing the areas of said oxide layer which are exposed after removal of corresponding areas of said metal layer before forming said trench.

14. The process of claim 12, wherein said metal layer is aluminum having a thickness of about 0.1 μm to about 1.0 μm.

15. The process of claim 13, wherein said oxide has a thickness of about 0.1 μm to 1.0 μm.

16. The process of claim 12, wherein said process further comprises:
   masking the surface of said wafer against the implanting by the portion of said hard photoresist mask comprised of said metal layer.

17. The process of claim 13, wherein said process further comprises:
   masking the surface of said wafer against the implanting by the portion of said hard photoresist mask comprised of said metal layer.

18. The mask of claim 1, wherein said metal layer is selected from the group consisting of aluminum, nickel, tungsten and tantalum and has a thickness of from about 0.1 μm to about 1.0 μm.

19. The process of claim 12, wherein said metal layer is selected from the group consisting of aluminum, nickel, tungsten and tantalum and has a thickness of from about 0.1 μm to about 1.0 μm.

20. The process of claim 12 further comprising:
   removing said photoresist atop said metal layer.

21. The hard mask of claim 1 further comprising:
   a photoresist layer formed atop a portion of said metal layer that forms at least one opening wherein said metal layer is exposed.

22. The hard mask of claim 21 further comprising:
   a plasma etched portion at said one opening, wherein said plasma etched portion extends to a surface of said semiconductor wafer.

23. The hard mask of claim 1, wherein a material associated with said hard mask is selected based on ion species and energy associated with said ion to be implanted.

* * * * *